(12) United States Patent
Han et al.

(10) Patent No.: US 9,281,481 B2
(45) Date of Patent: *Mar. 8, 2016

(54) POLYMERIC FLUORESCENT MATERIAL

(75) Inventors: Yang-Kyoo Han, Seoul (KR); Je-Gwon Lee, Seoul (KR); Su-Hwa Kim, Seongnam-si (KR)

(73) Assignee: LG CHEM LTD., Seoul (KR)

( * ) Notice: Subject to any disclaimer, the term of this patent is extended or adjusted under 35 U.S.C. 154(b) by 159 days.

This patent is subject to a terminal disclaimer.

(21) Appl. No.: 13/992,939

(22) PCT Filed: Jun. 15, 2012

(86) PCT No.: PCT/KR2012/004757
§ 371 (c)(1),
(2), (4) Date: Jun. 10, 2013

(87) PCT Pub. No.: WO2012/177021
PCT Pub. Date: Dec. 27, 2012

(65) Prior Publication Data
US 2013/0260126 A1  Oct. 3, 2013

(30) Foreign Application Priority Data

Jun. 24, 2011 (KR) .................. 10-2011-0061930
Jun. 15, 2012 (KR) .................. 10-2012-0064361

(51) Int. Cl.
| | |
|---|---|
| *H01L 51/00* | (2006.01) |
| *C09K 11/06* | (2006.01) |
| *D01D 5/00* | (2006.01) |
| *D01F 6/26* | (2006.01) |
| *C08F 20/70* | (2006.01) |
| *C08F 120/54* | (2006.01) |

(Continued)

(52) U.S. Cl.
CPC .............. *H01L 51/004* (2013.01); *C09K 11/06* (2013.01); *D01D 5/0007* (2013.01); *D01F 6/26* (2013.01); *C08F 20/54* (2013.01); *C08F 20/70* (2013.01); *C08F 22/38* (2013.01); *C08F 120/54* (2013.01); *C08F 122/38* (2013.01); *C09K 2211/1416* (2013.01); *C09K 2211/1425* (2013.01); *Y10T 428/298* (2015.01)

(58) Field of Classification Search
None
See application file for complete search history.

(56) References Cited

U.S. PATENT DOCUMENTS 5,043,406 A    8/1991  Fong
5,280,078 A *  1/1994  Gregor ............... B01D 67/0093
                                                    525/328.2

(Continued)

FOREIGN PATENT DOCUMENTS

CN    1451671 A    10/2003
CN    1863838 A    11/2006

(Continued)

OTHER PUBLICATIONS

Hyung-Wan Kim, et al. Synthesis of New Thermo-Responsive Poly (Acrylamides) and Their Sol-Gel Phase Transition Behaviors in Aromatic Solvents; Polymer Preprints 2005, 46(2); p. 1061.

*Primary Examiner* — Mike M Dollinger
*Assistant Examiner* — Christina Wales
(74) *Attorney, Agent, or Firm* — Dentons US LLP

(57) ABSTRACT

The present invention relates to a polymeric fluorescent material, which comprises a novel acrylamide polymer so that it may emit fluorescence with higher efficiency and can be available especially for a white or blue light emitting material. The polymeric fluorescent material comprises a mesoporous acrylamide polymer including at least one repeating unit.

20 Claims, 3 Drawing Sheets

(51) Int. Cl.
  *C08F 122/38* (2006.01)
  *C08F 20/54* (2006.01)
  *C08F 22/38* (2006.01)

(56) References Cited

U.S. PATENT DOCUMENTS

2003/0146145 A1* 8/2003 Krotz et al. .................. 210/243
2013/0216472 A1* 8/2013 Han et al. .................. 423/648.1

FOREIGN PATENT DOCUMENTS

| CN | 101880343 A | 11/2010 |
| JP | 2003-034715 | 2/2003 |
| KR | 10-2003-0049208 | 6/2003 |
| KR | 10-2005-0056288 | 6/2005 |
| KR | 20050056288 A1 * | 6/2005 |
| KR | 10-0541748 B1 | 1/2006 |
| KR | 1111133 B1 * | 2/2015 |

* cited by examiner

POLYMERIC FLUORESCENT MATERIAL

This application is a National Stage Entry of International Application No. PCT/KR2012/004757 filed Jun. 15, 2012, and claims the benefit of Korean Application Nos. 10-10-2011-0061930 filed on Jun. 24, 2011 and 10-2012-0064361, filed Jun. 15, 2012 all of which are hereby incorporated by reference in their entirety for all purposes as if fully set forth herein.

TECHNICAL FIELD

The present invention relates to novel polymeric fluorescent materials. More specifically, the present invention relates to a polymeric fluorescent material comprising a novel mesoporous acrylamide polymer, which can emit fluorescence with higher efficiency even in a solid state and be available particularly for a white or blue light emitting substance.

BACKGROUND OF THE ART

Since the fluorescence of anthracene was reported in 1960s, research and development as to various substances emitting fluorescence have been actively done. In particular, there have been ongoing studies on different fluorescent substances usable for luminous substances in an organic light emitting diode, an organic solar cell, or the like, and vigorous researches have been conducted particularly on the polymeric fluorescent substance.

For example, since a conjugated polymer with π-conjugations (i.e., the portion where a saturated bonding and an unsaturated bonding exist in an alternating manner) was found to emit fluorescence due to its molecular rotation or vibration, many efforts have been exerted on using it as a polymeric fluorescent substance.

Furthermore, an isotactic polystyrene polymer having a stacked structure made of a plurality of phenyl groups in the repeating units has been reported almost uniquely to show fluorescence thanks to the presence of the stacked structure of the phenyl groups, despite the fact that it is an unconjugated polymer.

While the fluorescent conjugated polymers hitherto known in the art have some degree of fluorescence efficiency in their liquid state as being dissolved in a solvent with a high solubility, most of them show a low level of fluorescence efficiency when being in a solid state or being added to a solvent with a very low solubility. For this reason, the fluorescent conjugated polymers have found difficulties in being prepared as a thin film and thus their application for the luminous substance in the organic light emitting diode or the organic solar cells or for other various uses has been virtually limited, as well.

Moreover, the unconjugated isotactic polystyrene polymer has also had limits on its uses as a luminous substance in various fields because it shows merely an insufficient level of fluorescence and its production that entails using a special catalyst has been of great difficulty.

In addition, previously known fluorescent substances are predominantly typified in selectively emitting light of a certain wavelength only, and thus, emitting white or pale blue light close to white often requires using a plurality of fluorescent substances, and this has become one reason for making components for devices such as an organic light emitting diode or their production process more complicated.

In respect of the aforementioned problems, there remains a need to develop a novel polymeric fluorescent material capable of exhibiting fluorescence very efficiently even in a solid state and available for a white or blue light emitting substance.

DETAILED DESCRIPTION OF THE INVENTION

Technical Objectives

Thus, the present invention provides a polymeric fluorescent material capable of emitting fluorescence with higher efficiently even in a solid state and available particularly for a white or blue light emitting substance.

Technical Solutions

The present invention provides a polymeric fluorescent material comprising a novel mesoporous acrylamide polymer comprising at least one repeating unit of Chemical Formula 1:

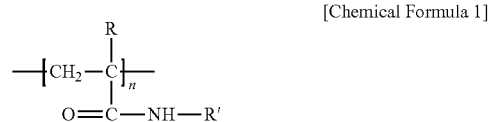

[Chemical Formula 1]

in Chemical Formula 1, n is an integer of 15 to 1800,

R is hydrogen or methyl,

R' is X,

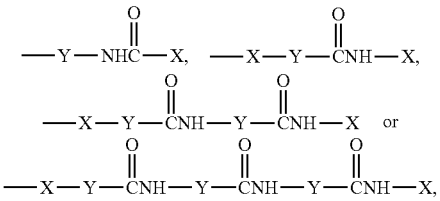

X is —Z—R",

Y is an alkylene of $C_1$ to $C_{10}$,

Z is an arylene of $C_6$ to $C_{20}$, and

R" is a linear or branched hydrocarbon of $C_{10}$ to $C_{20}$, or a linear or branched perfluorohydrocarbon of $C_{10}$ to $C_{20}$.

Hereinafter, the polymeric fluorescent material according to specific embodiments of the invention will be explained in detail.

According to an embodiment of the invention, a polymeric fluorescent material comprising a mesoporous acrylamide polymer including at least one repeating unit of Chemical Formula 1 is provided:

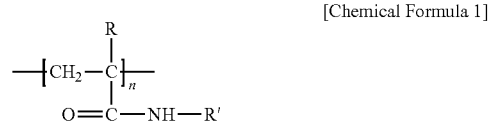

[Chemical Formula 1]

in Chemical Formula 1,
n is an integer of 15 to 1800,
R is hydrogen or methyl,
R' is X,

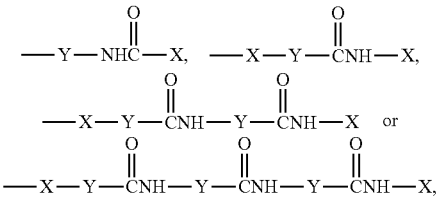

X is —Z—R",
Y is an alkylene of $C_1$ to $C_{10}$,
Z is an arylene of $C_6$ to $C_{20}$, and
R" is a linear or branched hydrocarbon of $C_{10}$ to $C_{20}$, or a linear or branched perfluorohydrocarbon of $C_{10}$ to $C_{20}$.

To complete the present invention, the present inventors have discovered that a certain type of acrylamide polymers may exhibit excellent fluorescence as they form a structure wherein the arylene groups (e.g., Z) capable of acting as a chromophore are densely stacked. In particular, as can be evidenced by the following examples, it has been found that such acrylamide polymers may absorb light of a broad range of wavelengths to be excited, thereby emitting different wavelengths of light corresponding to substantially the entire range of visible light. Therefore, according to an embodiment of the invention, a polymeric fluorescent material comprising the acrylamide polymer may be utilized by itself as a blue or white light emitting substance. Moreover, by controlling the wavelength of light being absorbed, the polymeric fluorescent material may selectively emit a specific wavelength of light, and thus the polymeric fluorescent material may be employed very properly as a luminous substance for various fields.

In addition, the acrylamide polymer and the polymeric fluorescent material comprising the same may have a high level of fluorescence efficiency even when they are in a solid state such as a solid thin film, a film, or a fiber, and they are produced in a relatively simple process, as well. Therefore, they can resolve most of the problems the conventional polymeric fluorescent materials have faced.

The polymeric fluorescent material comprising the acrylamide polymer may therefore be preferably utilized as a luminous material not only in various devices such as an organic light emitting diode, an organic solar cell, and the like, but also for other different uses.

Without being bound by any theory, it is believed that the excellent fluorescence of the acrylamide polymer and the polymeric fluorescent material is derived basically from the properties of the acrylamide polymer. The acrylamide polymer, which is produced by conducting a radical polymerization in a special manner (e.g., a RAFT polymerization) with a certain type of acrylamide monomers (hereinafter, a monomer of Chemical Formula 2), may exhibit a high level of regularity and crystallinity based on the following reasons:

The acrylamide monomer being used in the production of the acrylamide polymers has a chemical structure wherein a non-polar aliphatic hydrocarbon (having at least 10 carbon atoms) capable of being self-assembled, an arylene group triggering interaction between π-π orbitals, and an amide group capable of bringing forth an intra- or inter-molecular hydrogen bonding are introduced. The self-assembling behavior of the aliphatic long-chain hydrocarbons, the π-π interaction of the arylene groups, and the intra-molecular hydrogen bondings between the amide groups enable the monomers to form a regular monoclinic crystal structure in a solid state, e.g., a monoclinic monocrystal.

When a special type of radical polymerization is conducted with such monomers, the monomer molecules may therefore undergo polymerization while being well-oriented, and this ensures that each monomer molecule is orderly arranged in a polymer chain. More specifically, the polymerization reaction allows the well-oriented monomer molecules to be linked together, forming one polymer chain (e.g., one building block of a polymer), and such polymer building blocks may gather to form an orderly arranged polymer. Thanks to the polymer building blocks as orderly arranged in the polymer, it may have a structure wherein a plurality of the arylene groups being linked to the repeating unit of Chemical Formula 1 and being able to act as a chromophore (e.g., Z in Chemical Formula 1) are stacked with a narrow space therebetween. As a result, interaction occurring between the π-π orbitals of these arylene groups enables the acrylamide polymer and the polymeric fluorescent material including the same to exhibit such excellent fluorescence as described above.

Hereinafter, the acrylamide polymers will be explained in more detail, and then the polymeric fluorescent material comprising the same will be detailed.

In the acrylamide polymer being included as a main component in the fluorescent material, Z may comprise an arylene having 6 to 20 carbon atoms. More specifically, examples of the arylene include

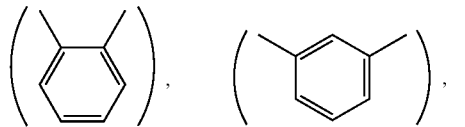

o-phenylene, m-phenylene

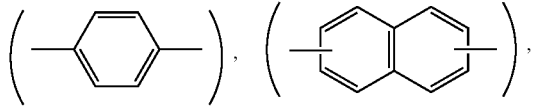

p-phenylene, naphthalene

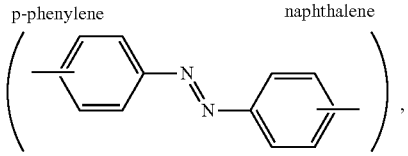

azobenzene

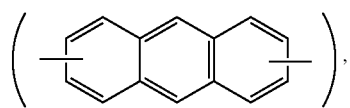

anthracene

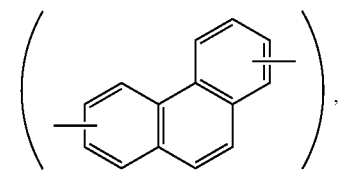

phenanthrene

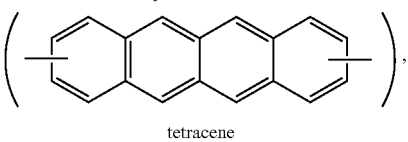

tetracene

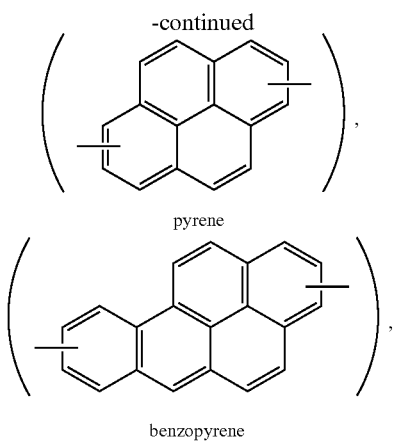

pyrene benzopyrene and the like, and other various arylene group may also be utilized. With Z comprising the arylene group, the acrylamide polymer and the polymeric fluorescent material comprising the same may exhibit an excellent level of fluorescence.

In addition, R" may be a linear or branched aliphatic hydrocarbon being substituted at the o-, m-, or p-position of the aromatic rings in Z, and the hydrocarbon has a long chain length of at least 10 carbon atoms, more specifically, 10 to 20 carbon atoms. In addition, the hydrocarbon of R" may be substituted with fluorine and R" may be a linear or branched perfluorohydrocarbon of $C_{10}$ to $C_{20}$.

As the repeating unit of Chemical Formula 1 and the monomer of Chemical Formula 2 as described below include the long chain hydrocarbon and the arylene, regularity or crystallinity of the polymers would become more remarkable, resulting in excellent fluorescence.

The polymer may also be either a homo-polymer consisting of one type of the repeating unit of Chemical Formula 1, or a copolymer consisting of at least two repeating units.

The acrylamide polymer may also show mesoporosity comprising a number of mesopores with a diameter of about 3.0 to 10.0 nm or about 3.0 to 6.0 nm in a solid state. In this regard, the "diameter" of the pores may be defined as the length of the longest line among the straight lines connecting two different points on a circle, an oval, or a polygonal of the cross-section of each pore. It is expected that the mesoporosity of the polymer may bring about scattering of electrons in a confined space, affecting the realization of white or blue fluorescence. In other words, electrons are confined within the mesopores contained in the polymer so that escape of the electrons from the fence of polymer chains is likely to be retarded and scattering of the electrons occurs, and thus white or blue fluorescence is likely to be generated with higher efficiency. Therefore, the acrylamide polymers hold promise for being desirably utilized as a fluorescent material emitting white or blue fluorescence.

The polymer has a number average molecular weight of about 5,000 to about 500,000, or a number average molecular weight of about 7,000 to about 300,000. In addition, the polymer may be a crystalline polymer with a melting point ($T_m$) of about 200° C. to 300° C., or about 220° C. to 280° C. As the polymers have the melting temperature and the molecular weight falling in the aforementioned ranges, they may exhibit outstanding thermal stability resulting from the high melting temperature and the high molecular weight and also be easily prepared as electrospun fibers by using a electrospinning process without losing any of their excellent properties.

According to what the present inventors have found, the acrylamide polymers may become a polymer having crystallinity and regularity with a melting temperature falling in the aforementioned range. Accordingly, unlike any other previously known polymers having a similar structure, they may show different mesoporosity and a high level of regularity and crystallinity. Thanks to such regularity, crystallinity, and the like, the polymers may form a structure wherein the arylene groups are densely stacked, thereby exhibiting excellent fluorescence. Besides, the mesoporosity of the polymer is likely to cause scattering of electrons so that the polymer and the polymeric fluorescent material are expected to be available for a white or blue fluorescent substance. The melting point and the crystallinity of the polymers may be confirmed through a structural analysis of a solid polymer conducted by using a small angle X-ray scattering (SAXS) and an wide angle X-ray scattering (WAXS), and via a thermal analysis of the phase transition temperature of the polymers conducted by using differential scanning calorimetry (DSC).

The acrylamide polymers and the polymeric fluorescent material as described above may be in the form of a polymer itself (e.g., a solid powder of a polymer), but they may also be shaped as a thick or thin film comprising the acrylamide polymer. The polymer and the polymeric fluorescent material can show excellent fluorescence and a high level of fluorescence efficiency even when they are in the form of such a thick or thin film of the polymer. Therefore, the polymers and the polymeric fluorescent materials may be very advantageously utilized as a luminous material in all sorts of devices.

The thick or thin film may be obtained by any conventional process for forming a polymeric thick or thin film, wherein the acrylamide polymer is dissolved in a solvent and dried in a mold (such as in a solvent casting method), or the polymer is melted and molded into a shape, or the solution of the polymer is spin-coated onto a substrate. The thickness of the thick or thin polymeric film depends on the concentration of the polymer and the organic solvent and the polymer concentration. The mesoporous acrylamide polymer and the fluorescent material comprising the same may exhibit excellent fluorescence even when being prepared as a thick or thin film, and the (thin) film formation can be easily made, as well.

The thickness of the film thus prepared may vary with the coating conditions or the concentration of the polymer solution used in a spin coating method or a solvent casting method. The thin film may therefore have a thickness of about 20 to 1000 nm depending on the spin coating conditions, and the thick film may have a thickness of about 1 μm to 1000 μm depending on the solvent casting conditions. By way of a specific example, the thick film may have a thickness of about 5 to 600 μm. In addition, the compression molding method may produce a thick film controlled to have a thickness of about 40 μm to 1 cm.

The results of investigating the fluorescence of the polymeric films produced show that the fluorescence intensity increases as the film is getting thicker. Without being bound by any theory, it is believed that such phenomenon may result from the aggregation induced fluorescence emission enhancement (AIEE) wherein the fluorescence emission increases not only by the stacking of the phenyl groups in the mesoporous acrylamide polymer but also by the aggregation of the polymer chains. In other words, it can be inferred that due to the stacking of the phenyl groups in uniform nanopores introduced into the mesoporous acrylamide polymer, the excited electrons are confined therein and thus cannot escape from the fence of polymer chains, and this brings about the electron scattering, resulting in the emission of fluorescence close to white or blue light.

Therefore, by adjusting the thickness of the thick or thin film or by using a blended thick or thin film comprising a small molecular fluorescent substance, one may control the intensity of fluorescence per wavelength, thereby having light of a desired wavelength be selectively emitted. Therefore, the thick or thin film may be desirably used as a luminescent substance in various fields.

The polymeric fluorescent material comprising the acrylamide polymer may also be formed as electrospun fibers comprising such polymers. As substantiated by the following examples, the electrospun fibers have a larger surface area together with the regularity and the crystallinity so that they may fluoresce at a level equal to or higher than the thick or thin film.

The electrospun fibers may have a fiber diameter of 200 nm to 20 μm, or about 250 nm to 10 μm. The term "(fiber) diameter of the electrospun fiber" may be defined as the length of the longest line among the straight lines connecting two different points on a circle, an oval, or a polygon that makes the cross-section of each fiber. The diameter of the electrospun fiber may be changed by controlling the conditions of electrospinning or the types of the repeating units or the molecular weight of the acrylamide polymer, and the electrospun fibers may have a different size such as a diameter within the foregoing range. By controlling the size, the electrospun fibers and the polymeric fluorescent materials comprising the same demonstrate a controlled level of fluorescence in terms of the fluorescence intensity or the wavelength and thus find their applications as a luminescent material in different fields.

The foregoing acrylamide polymer and the electrospun fiber including the same may be prepared by the production method as set forth hereinbelow.

First, the acrylamide polymer may be prepared by a method of comprising the steps of carrying out a radical polymerization (e.g., a RAFT polymerization) with reactants including at least one monomer of Chemical Formula 2 in the presence of a radical initiator and optionally a reverse addition fragmentation transfer (RAFT) reagent; and precipitating the polymerization product in a non-solvent:

[Chemical Formula 2]

In Chemical Formula 2, R and R' are the same as defined in Chemical Formula 1.

As such, the acrylamide monomer having a certain structure of Chemical Formula 2 can be subjected to a radical polymerization under particular conditions in a particular manner (e.g., RAFT polymerization) and precipitated in a non-solvent to easily provide an acrylamide polymer with the aforementioned regularity and crystallinity. Sufficient explanations as to the reasons why the polymers prepared in such manners would have the regularity and the crystallinity have already been presented, and thus further explanation will now be omitted. To the conclusion, the relatively simple radical polymerization process alone makes it possible to prepare the acrylamide polymer without any additional chemical treatment. Therefore, the polymeric fluorescent material comprising such polymers can be far more easily prepared than any other polymeric fluorescent material hitherto known in the art.

In the foregoing production method, the polymerization step may be preceded by the steps of forming a reaction solution comprising the radical initiator, the RAFT reagent, and the reactants; putting the reaction solution into a polymerization ample and removing oxygen therefrom via a freezing and thawing method; and sealing the ample. As such, each reactant, the initiator, and the like are placed in an oxygen removed polymerization ample before the polymerization being triggered, and thus the RAFT polymerization, which is known as a type of a living radical polymerization, may conducted more appropriately, enabling one to obtain the acrylamide polymer at a higher conversion rate.

In the production method, the precipitation may be followed by additional steps of dissolving the precipitated polymers in an organic solvent; and re-precipitating the polymer solution by using a non-solvent. With such an additional re-precipitation, crystalline acrylamide polymers can be more readily obtained.

In the production method, one may also use any acrylamide monomer having a structure of Chemical formula 2 as a monomer. Specific examples of the monomer include N-(p-dodecyl)phenyl acrylamide (DOPAM), N-(p-tetradecyl)phenyl acrylamide, (TEPAM), N-(p-hexadecyl)phenyl acrylamide (HEPAM), N-(p-dodecyl)naphthyl acrylamide (DONAM), N-(p-tetradecyl)naphthyl acrylamide (TENAM), N-(p-hexadecyl)naphthyl acrylamide (HENAM), N-(p-dodecyl)azobenzenyl acrylamide, (DOAZAM), N-(p-tetradecyl)azobenzenyl acrylamide (TEAZAM), N-(p-hexadecyl)azobenzenyl acrylamide (HEAZAM), and N-[4-(3-(5-(4-dodecyl-phenylcarbamoyl)pentyl-carbamoyl)-propyl) phenyl acrylamide (DOPPPAM). Needless to say, it is possible to use at least two monomers selected from the foregoing ones.

As supported by the following examples, the monomer can be in the form of a monoclinic crystal structure, preferably a monoclinic monocrystal. Because the monomer as obtained in the form of monoclinic monocrystal is subjected to a RAFT polymerization to produce a polymer, each monomer molecule is more regularly arranged in the polymer chain and such well-arranged monomer molecules are linked each other to more advantageously prepare a polymer having regularity and crystallinity.

In order to obtain the monomer in the form of a monocrystal, one may add an agent for crystal growth to the monomers being synthesized in a polar and/or non-polar solvent so as to grow them in the form of a monocrystal. At this time, the growth rate of the monocrystal may be determined depending on the composition and the ratio of the polar solvent and the non-polar solvent being used, the time and the temperature of crystal growth, the chemical structure and the concentration of the agent for crystal growth being added.

In addition, a radical initiator, a RAFT reagent, monomers, and the like may be dissolved in an organic solvent to provide a reaction solution, in which the RAFT polymerization may be conducted. As the organic solvent, it is possible to use at least one non-polar solvent selected from the group consisting of n-hexane, cyclohexane, benzene, toluene, chlorobenzene, dichlorobenzene, methylene chloride, and 1,2-dichloroethane, or at least one polar solvent selected from the group consisting of acetone, chloroform, tetrahydrofuran (THF), dioxane, monoglyme, diglyme, dimethylformamide (DMF), dimethylsulfoxide (DMSO), and dimethylacetamide (DMAC). It is also possible to use a mixed solvent of the non-polar and polar solvents. Moreover, the aforementioned organic solvent may be used in the reprecipitation step to dissolve the polymerization product.

In the reaction solution, the monomer may be dissolved at a concentration of about 3.0 to 50% by weight, or about 5.0 to 40% by weight with respect to the organic solvent. The reaction solution with the monomer dissolved at such a concentration may effectively undergo a subsequent polymerization.

In addition, as the radical initiator being used together with the monomer, one may use any radical initiator known in the art to be available for the radical polymerization without particular limitations. Specific examples of the radical initiator include azobisisobutyronitrile (AIBN), 2,2'-azobis-(2,4-dimethylvaleronitrile), benzoyl peroxide (BPO), and di-t-butyl peroxide (DTBP), and it is possible to use at least two compounds selected from the foregoing ones.

Further, as the RAFT reagent, one may use a thermal decomposition initiator such as S-1-dodecyl-S'-($\alpha,\alpha'$-dimethyl-$\alpha''$-acetic acid)trithiocarbonate, cyanoisopropyl dithiobenzoate, cumyl dithiobenzoate, cumyl phenylthioacetate, 1-phenylethyl-1-phenyldithioacetate, or 4-cyano-4-(thiobenzoylthio)-N-succinimide valerate, and it is also possible to use a mixture of at least two compounds selected from the foregoing ones.

The radical initiator and the RAFT reagent may be used at a ratio of about 0.001 to 5.0% by weight with respect to the weight of the monomer.

In the above production method, the RAFT polymerization may proceed at a reaction temperature of about 60 to 140° C. In addition, the RAFT polymerization may be carried out for about 30 to 200 hours, and more specifically about 50 to 170 hours.

In the precipitation or the re-precipitation of the production method, one may also use any solvent not dissolving the polymerization product or the acrylamide polymers as the non-solvent. Examples of the non-solvent include a polar solvent such as methanol, ethanol, n-propanol, iso-propanol, or ethylene glycol, or a non-polar solvent such as n-hexane, cyclohexane or normal heptanes. Needless to say, it is possible to use a mixed solvent of at least two compounds selected from the foregoing ones. Through the precipitation and the re-precipitation processes with using such a non-solvent, one may more easily obtain a polymer having the regularity and the crystallinity at high purity.

The electrospun fibers comprising the foregoing polymer may be prepared in a method comprising the steps of dissolving the acrylamide polymer comprising at least one repeating unit of Chemical Formula 1 in an organic solvent; and electrospinning the polymer solution.

In this method, the acrylamide polymer prepared by the aforementioned method is first dissolved in an organic solvent to provide a polymer solution for the electrospinning. As the organic solvent for dissolving the polymer, it is possible to use any of various organic solvents capable of dissolving the polymer. In other words, one may use at least one non-polar solvent selected from the group consisting of n-hexane, cyclohexane, benzene, toluene, chlorobenzene, dichlorobenzene, methylene chloride, and 1,2-dichloroethane, or at least one polar solvent selected from the group consisting of acetone, chloroform, tetrahydrofuran (THF), dioxane, monoglyme, diglyme, dimethylformamide (DMF), dimethylsulfoxide (DMSO), and dimethylacetamide (DMAC). It is also possible to use a mixed solvent of at least two selected from the foregoing ones or a mixed solvent of the non-polar and polar solvents. With using a mixed solvent, the amount of the polar solvent in a total solvent may range from about 60 to 90% by weight. In the polymer solution, the polymer may be dissolved in an organic solvent at a concentration of about 10 to 40% by weight. However, the type and the concentration of the solvent may be selected depending on the specific chemical structures of the acrylamide polymer and its molecular weight.

After the formation of the polymer solution as described above, it may be subjected to an electrospinning process to provide electrospun fibers. Various characteristics such as chemical properties or a physical shape of the electrospun fibers may be affected by all the conditions such as a molecular structure, a morphological structure, and a molecular weight of the polymers as used, and a type and a concentration of the organic solvent as employed a spinning speed of a polymer solution (mL/min), a voltage applied to an electrospinning machine, a diameter of a spinning needle, a distance between a needle and a fiber collector, and the like.

In this respect, in order to produce electrospun fibers having a more uniform diameter, the electrospinning is preferably conducted under a voltage applied at about 10 to 30 kilovolt. In addition, the electrospinning may be carried out in an electrospinning machine including a nozzle with its inner diameter between about 0.1 and 0.7 mm, with the distance between the nozzle and the collector being from 10 to 30 cm.

The spinning speed of the electrospinning may vary with the types of the polymers, the molecular weight thereof, and the type or the concentration of the solvent, but in order to produce electrospun fibers having the aforementioned crystallinity, no bead formation, and a uniform surface, the electrospinning is preferably carried out at a spinning speed of about 5 to 20 mL/min.

Through the aforementioned method, electrospun fibers typified in crystallinity and a large surface area may be prepared and with using this, a polymeric fluorescent material may be provided in accordance with an embodiment of the invention.

The polymeric fluorescent material according to an embodiment of the invention may be prepared by a typical production method of a polymeric fluorescent material except for comprising the acrylamide polymer as described above, and films or electrospun fibers including the same. Where appropriate, the polymeric fluorescent materials may also include a variety of organic, inorganic, or polymeric fluorescent substances or additives that have been previously used in the art besides the foregoing acrylamide polymers.

With absorbing light of a wavelength between about 300 nm and 700 nm, more specifically, between about 320 nm and 550 nm, the polymeric fluorescent material may be excited to emit fluorescence. By absorbing light of such a broad range of wavelengths, it may generate light of a broad range of wavelengths from (an absorbed wavelength+10) nm to (2×an absorbed wavelength−10) nm (e.g., between about 320 nm and about 900 nm), for example, light of a broad range of wavelengths corresponding to substantially the entire range of visible light. Because the polymeric fluorescent materials may simultaneously emit visible light of such a broad range of wavelengths, it may be utilized as a white or blue light-emitting material by itself, and very properly applied for various devices such an organic light emitting diode.

In addition, by controlling the wavelength of light absorbed in the polymeric fluorescent material, the polymeric fluorescent material may selectively emit light of a certain wavelength. For example, with absorbing light of a wavelength between about 300 nm and about 400 nm, more specifically between about 330 nm and about 385 nm, the polymeric fluorescent material may emit blue light, e.g., light having a wavelength of about 350 nm to 450 nm. In addition, with absorption of light of a wavelength between about 400 nm and about 500 nm, specifically between about 460 nm and about 490 nm, the polymeric fluorescent material may emit green light, e.g., light of a wavelength between about 450 nm and about 550 nm. Further, with absorption of light of a wavelength between about 500 and 600 nm, specifically, between about 510 nm and 550 nm, the polymeric fluorescent material may emit red light, e.g., light of a wavelength between about 600 nm and 800 nm.

The polymeric fluorescent material may be advantageously utilized as various luminescent substances for different uses (such as a device) because light of a certain wavelength may be selectively emitted therefrom. By way of an example, the polymeric fluorescent material may be preferably employed as fluorescent or luminescent materials in different uses and fields such as white illumination, an organic light emitting diode, an organic solar cell, a color filter for a display device, a backlight, a chemosensor, or a fluorescent imaging for detecting various substances.

Advantageous Effect of the Invention

As described above, according to the present invention, a polymeric fluorescent material may be produced, which may exhibit excellent fluorescence and a higher level of fluorescence efficiency even when they are in the form of a solid film or a fiber, and can be used by itself for a white or blue light emitting substance and be prepared with a relatively simple method. These outstanding characteristics of the polymeric fluorescent material seem to stem from the unique properties of the novel mesoporous acrylamide polymer such as the crystallinity, the nanopore structure, the regularity, and the like.

Therefore, the polymeric fluorescent material may be advantageously used as a luminous material for different devices such as an organic light emitting diode or an organic solar cell or in other uses.

EXAMPLES

Figure 1:
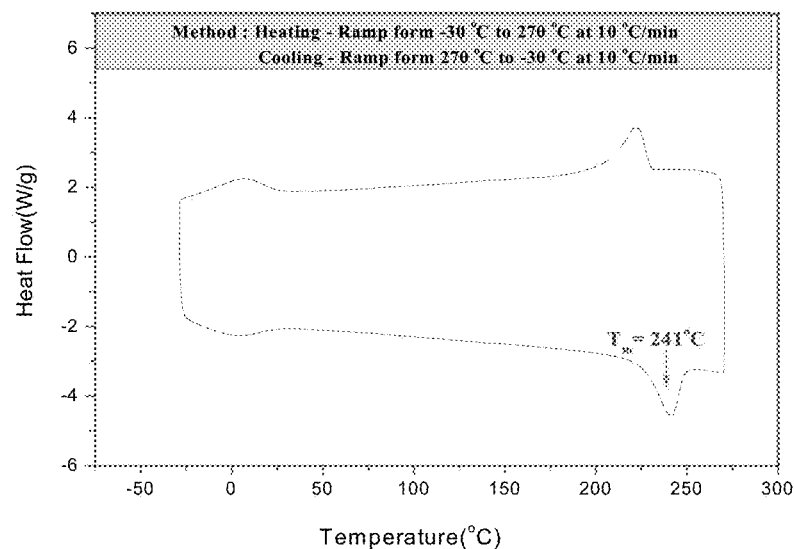
FIG. 1 shows a DSC thermal curve of the polymer prepared in Example 2.

Hereinafter, the actions and the effects of the invention will be explained in further detail with reference to specific examples of the invention. However, they are merely presented by way of an example of the present invention, the scope of which shall not be defined thereby.

Examples 1

Synthesis of an Acrylamide Monomer and Determination of its Crystallinity-Synthesis of Paradodecyl Acrylamide (DOPAM) and the Preparation of its Monocrystal First, 12 g (0.046 mol) of paradodecyl aniline was dissolved in 100 mL of THF and then put into a 100 mL three-neck round bottom flask. To this solution was added dropwise through a funnel over 10 minutes an acid remover prepared by mixing imidazole and triethyl amine at an equivalent mole ratio (0.023 mol). Then, to the resulting solution was slowly added dropwise through a dropping funnel over 20 minutes under a nitrogen atmosphere a solution prepared by dissolving 3.8 ml (0.047 mol) of acryloyl chloride in 20 mL of THF. At this time, the reaction mixture cooled with ice so as to keep its temperature below 5° C. Thereafter, the reaction proceeded at 0° C. for 6 hours, and then at 25° C. for 9 hours. After the completion of the reaction, the resulting solution was filtered with a filtering paper to remove salt precipitates, and then the solvent was eliminated by using an evaporator. The obtained solids were dissolved in 100 mL of dichloromethane and put into a separating funnel together with 50 mL of an aqueous solution of 10% $NaHCO_3$ and shaken strongly to separate the aqueous solution layer and to remove the unreacted portion of acryloyl chloride. To the dichloromethane solution being separated was added 1.0 g of magnesium sulfate and the resulting mixture was stirred for 5 hours and filtered to remove a trace amount of water being dissolved in the solvent. The resulting dichloromethane solution was evaporated and then 100 mL of n-hexane was added thereto and stirred for 2 hours, and then was filtered to remove the unreacted portion of paradodecyl aniline remained in the solution. The solvent was removed from the resulting solution by using an evaporator to provide white solids of DOPAM (Yield: 95%). The chemical structure of DOPAM as synthesized was confirmed by a $^1H$ nuclear magnetic resonance ($^1H$-NMR) spectrum, and the results are the same as follows:

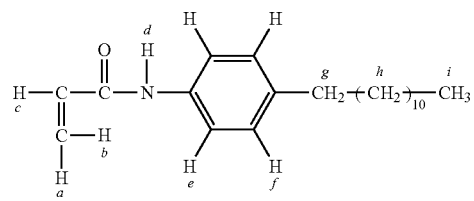

$^1H$-NMR ($CDCl_3$): e, δ7.5 (d, 2H); d, δ7.2 (s, 1H); f, δ7.15 (d, 2H); b, δ6.4 (d, 1H); c, δ6.2 (q, 1H); b, δ5.8 (d, 1H); g, δ2.6 (t, 2H); h, δ1.25-1.35 (m, 20H); i, δ0.935 (t, 3H).

Also, DOPAM as synthesized ($T_m$=101° C.) was purified again by being subjected to recrystallization with ethanol three times. The pure DOPAM as purified was put into THF and then a few drops of a non-polar solvent was added thereto, and the resulting mixture was kept below −10° C. for a certain period of time to grow monocrystals of the monomer. At this time, the growing rate of the monocrystal was found to depend on the composition and the ratio of the polar and non-polar solvents as used, the time and the temperature for crystal growth, the chemical structure and the concentration of the agent for crystal growth as added.

X-ray diffractometry (XRD) was used to analyze the crystal structure of the monocrystal obtained in Example 1, providing the crystallographic data of the monocrystal as set forth in Table 1. Based on such crystallographic data, the monocrystal of the monomer of Example 1 was confirmed to have a monoclinic crystal structure.

TABLE 1

Crystallographic data for the monocrystal of the monomer obtained from Example 1

| | |
|---|---|
| Empirical formula | $C_{21}H_{33}N_1O_1$ |
| Formula weight | 315.48 |
| Temperature [K] | 293(2) K |
| Wavelength [Å] | 0.71073 |
| Crystal system, space group | Monoclinic, $P2_1/c$ |
| a [Å] | 4.7055(13) |
| b [Å] | 43.315(16) |
| c [Å] | 9.4150(19) |
| β [°] | 95.158(19) |
| Volume [Å$^3$] | 1911.2(10) |
| $d_{calcd}$ [gcm$^{-3}$] | 1.096 |
| μ [mm$^{-1}$] | 0.066 |
| F(000) | 696 |
| Crystal size [mm] | 0.55 × 0.30 × 0.25 |
| θ range [°] | 1.88-26.33 |
| Data/parameters | 1845/213 |
| GOF on F$^2$ | 1.111 |
| R1, wR2 [I > 2σ(I)] | 0.0975, 0.2551 |
| Largest diff. peak and hole [e · Å$^{-3}$] | 0.358 and −0.343 |

Examples 2-5

Synthesis of Novel Acrylamide Polymers

Example 2

Poly(DOPAM) Preparation-1

1.0 g of a DOPAM monomer in the form of a rod-like crystal obtained from Example 1 was dissolved in 6.3 mL of THF and then was put into a 10 mL Schenk flask together with 0.87 mg of a radical initiator, AIBN, and 1.75 mg of a RAFT reagent, cyanoisopropyl ditiobenzoate, dissolved in 6.3 mL of THF. The resulting mixture was stirred for 30 minutes under a nitrogen atmosphere to remove oxygen from the solution, and then the flask was placed in a silicone oil bath at 70° C. to carry out a RAFT polymerization for 72 hours. After the polymerization reaction, the reaction solution was precipitated in 200 mL of methanol, and the resulting precipitate was filtered to obtain orange solids. The obtained solids were dissolved again in 8 mL of THF and re-precipitated in an excess amount of methanol. The pale yellow solids thus obtained were dried in a vacuum oven for 24 hours to produce a pure homopolymer, Poly(DOPAM)-1 of Chemical Formula 3 as follows:

[Chemical Formula 3]

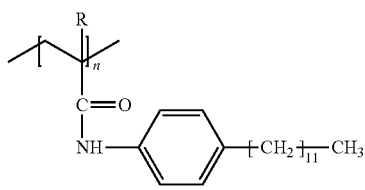

The conversion rate of the polymerization and the number average molecular weight were 48% and 14,900, respectively. The obtained polymer had a very narrow molecular weight distribution of 1.25 and a melting temperature ($T_m$) of 241° C.

Example 3

Poly(DOPAM) Preparation-2

A pure Poly(DOPAM)-2 was obtained in the same manner as set forth in Example 2 except for using 1.5 g of a rod-like crystalline DOPAM monomer obtained from Example 1, 7.8 ml of benzene, 2.63 mg of cyanoisopopyl dithiobenzoate, the RAFT reagent, and 1.3 mg of AIBN. The polymerization conversion rate and the number average molecular weight of the polymer were 66% and 35,000, respectively. The polymer had a relatively narrow molecular weight distribution of 1.39, and a melting temperature ($T_m$) of 242° C.

Example 4

Poly(DOPAM) Preparation-3

1 g of a DOPAM monomer in the form of a rod-like crystal obtained from Example 1 was put into a 20 mL ample together with 6.3 mL of a THF/benzene (30/70 v/v) mixed solvent and 10 mg of an initiator, BPO. From the resulting solution was removed oxygen by using a freezing-thawing method and then the ample was sealed and subjected to a radical polymerization in an oven at 80° C. for 48 hours. After the polymerization reaction, the reaction solution was precipitated in 300 mL of methanol, and the resulting precipitate was then filtered to obtain pale yellow solids. The solids thus obtained were dissolved again in 10 mL of THF and re-precipitated in an excess amount of methanol. The solids thus obtained were dried in a vacuum oven over one day to produce a pale yellow homopolymer, Poly(DOPAM)-3. The polymerization conversion rate and the number average molecular weight were 94% and 99,000, respectively. The obtained polymer was found to have a molecular weight distribution of 3.2 and a melting temperature ($T_m$) of 242° C.

Example 5

Poly(DOPAM) Preparation-4

A pure Poly (DOPAM)-4 was obtained in the same manner as set forth in Example 4 except for using 1 g of a rod-like crystalline DOPAM monomer obtained from Example 1, 6.5 ml of benzene, and 10 mg of BPO, the initiator, and setting the polymerization time as 72 hours. The polymerization conversion and the number average molecular weight were 97% and 115,000, respectively. The obtained polymer was found to have a molecular weight distribution of 3.4 and a melting temperature ($T_m$) of 242° C.

Experimental Example 1

Analysis of Thermal Characteristics and Crystallinity of the Acrylamide Polymer—Analysis of Thermal Characteristics of the Polymer by DSC Phase transition behavior of Poly(DOPAM) obtained from Example 2 was investigated by using a DSC thermal analyzer, confirming that Poly(DOPAM) is a crystalline polymer with a melting temperature ($T_m$) of 241° C.

Referring to FIG. 1, it shows a DSC curve illustrating a thermal phase transition temperature behavior of Poly (DOPAM)-1 as obtained in Example 2. Reference to FIG. 1 confirms that Poly(DOPAM) of a crystalline structure formed with polymer chains has a melting temperature ($T_m$) of 241° C. In addition, the melting temperature of the microcrystals formed by the aliphatic hydrocarbons introduced at the end of the repeating units was found at about 5° C. The phase transition melting temperatures are shown at almost the same temperature region with a similar heat capacity in the heating or cooling curves, and from such results, it is expected that the crystalline structures formed in the polymer chains of Poly (DOPAM) are oriented in a relatively stable manner. In addition, when the number average molecular weight of Poly (DOPAM) was above 8000, no big differences were shown in the melting temperature.

Examples 6

Preparation of a Fluorescent Film Comprising Novel Acrylamide Polymers-Film Preparation by Using a Teflon Mold Poly(DOPAM)-1 as synthesized in Example 2 was dissolved in $CHCl_3$ to prepare polymer solutions having a concentration of 2-10 wt %. The polymer solution was put into a Teflon mold (3 cm×7 cm) and dried in the atmosphere for 24 hours and then in the vacuum oven for 24 hours to prepare a fluorescent film. The film was made to have a thickness of 50 μm, 100 μm, 270 μm, 320 μm, and 600 μm, respectively, by controlling the concentration of the solution and the molecular weight of the polymer.

Examples 7-10

Production of Electrospun Fibers from Novel Acrylamide Polymers

Example 7

To prepare electrospun fibers with using an electrospinning machine (ESR-200RD) from Korea NanoNC Co. Ltd., 1.0 g of Poly(DOPAM)-3 being synthesized from Example 4 was dissolved in 5.1 mL of THF, and 5 mL of the resulting polymer solution was put into a syringe and subjected to electrospinning with using a 25 gauge stainless steel needle (diameter: 0.508 mm). At this time, the applied voltage was 15 kV, the spinning speed was 15 mL/min, and the distance between the needle and the collector was 12 cm. The electrospun fibers thus obtained were found to have a uniform size with a diameter of 250 to 450 nm.

Example 8

Electrospun fibers were prepared by the electrospinning carried out under the same condition as in Example 7, except for using 1.0 g of a novel mesoporous polymer, Poly (DOPAM)-4 as synthesized in Example 5, 2.9 ml of THF, and an applied voltage of 10 kV. It was found that the electrospun fibers thus obtained had a diameter of about 7 μm with a uniform surface and no bead formation.

Example 9

Electrospun fibers were prepared by the electrospinning carried out under the same condition as in Example 8, except for using an applied voltage of 15 kV. The electrospun fibers thus obtained were found to have a uniform size with a diameter of about 6 μm.

Example 10

Electrospun fibers were prepared by the electrospinning carried out under the same condition as in Example 8, except for using 3.4 mL of THF and an applied voltage of 20 kV. The electrospun fibers thus obtained were found to have a uniform size with a diameter of about 2 μm.

Experimental Example 2

Evaluation of Fluorescence for the Fluorescent Films and the Electrospun Fibers Comprising Novel Acrylamide Polymers 1. UV-Visible Spectrum Using a spectrophotometer (model name: CARY-100 conc, manufactured by Varian Co. Ltd.), a UV visible absorption spectrum of the fluorescent film obtained from Example 6 (film thickness: 100 μm) was determined. The absorption spectrum is shown in FIG. 2.

Figure 2:
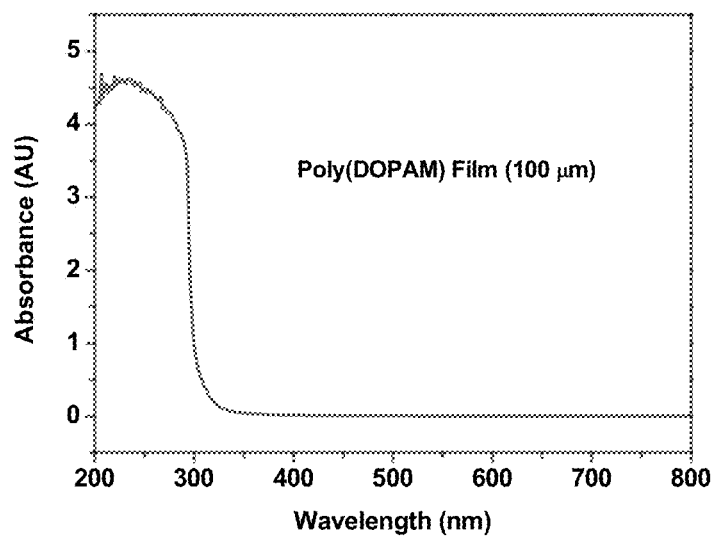
FIG. 2 shows a UV-visible absorption spectrum of the fluorescent film as obtained in Example 6.

Referring to FIG. 2, it is found that the fluorescent film shows a low level of absorption below 4.0 to 1.0% at a wavelength of about 300-330 nm, and it absorbs only a little amount of light with an absorption degree of 1.0% or less at a wavelength higher than 330 nm.

2. Fluorescence Spectrum

① Measurement of Fluorescence of the Fluorescent Film and Electrospun Fiber of Poly(DOPAM)

The fluorescence of the fluorescent film (thickness: 100 μm) of Example 6 and the electrospun fibers of Example 7 was measured by using a PL apparatus (model: F-900) equipped with a 450 W Xenon arc lamp from EDINBURGH Instruments Co. Ltd. At this time, excitation scan on Poly (DOPAM) constituting the fluorescent film and the electrospun fiber confirmed an occurrence of a high level of excitation at a wavelength of 365 nm, which was then determined as an excitation wavelength for measuring fluorescence. Thus, with irradiating the fluorescent film and the electrospun fiber with an excitation beam having a wavelength of 365 nm, the fluorescence emission spectrum between 375 nm to 720 nm was scanned to produce a PL spectrum. The scanning was conducted 10 times at a temperature of 30° C. with a size of a scan slit of 2 and a dwell time of 0.2 seconds. The fluorescence emission spectrum of the fluorescent film is shown in FIG. 3.

Figure 3:
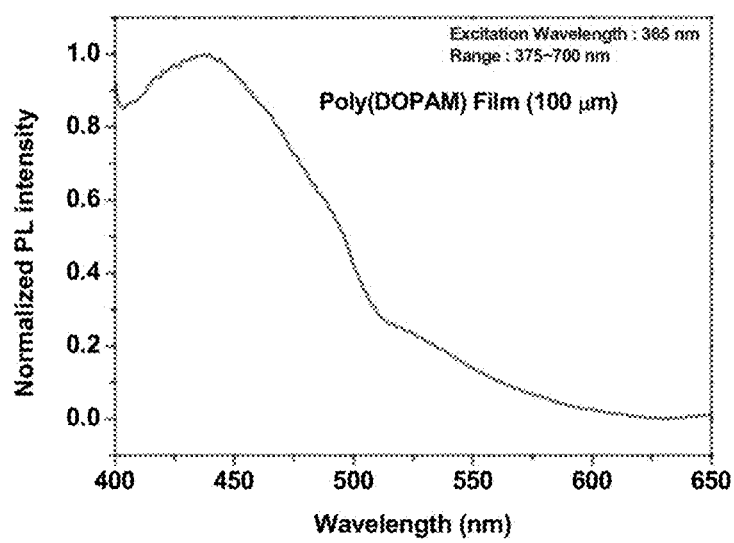
FIG. 3 shows a fluorescent emission spectrum of the fluorescent film obtained in Example 6.

Referring to the results of the above experiments and FIG. 3, the fluorescent film and the electrospun fibers may emit fluorescent light having a wide range of wavelengths of about 375 nm to 720 nm (i.e., corresponding to virtually the entire range of visible light).

Among the mesoporous acrylamide polymers of the present invention, Poly(DOPAM) in the polymer film prepared in Example 6 (thickness: 100 μm) has a phenyl group that may be the worst chromophore and thus shows a very low level of absorption for visible light, but despite this, it emits fluorescence in a broad range of wavelengths between 400 nm and 650 nm. Such results indicate that the emission of fluorescence is enhanced by the aggregation and the stacking of the phenyl groups, and the excited electrons are scattered in the nanopores, as well.

With a known method of measuring a fluorescence efficiency by using a blended polymer film of 9,10-diphenylanthracene/PMMA as a standard sample (see, Macromolecules, 32, 7422-7429, (1999)), the fluorescence efficiency of the polymer film prepared in Example 6 was determined. The results show that it has a fluorescence efficiency between about 20% and 60%. In addition, the fluorescence efficiency is found to be enhanced as the film thickness increases from 50 to 600 μm.

C. Decay time of the fluorescent film and the electrospun fibers of Poly(DOPAM)

With using EPL-375 picosecond pulse diode laser installed on the PL apparatus, F-900 from EDINBURGH Instruments Co. Ltd., the decay time was measured for the fluorescent films obtained in Example 6 (thickness: 320 μm and 100 μm) and the electrospun fibers obtained in Example 8, respectively. The sample was irradiated with a laser having a wavelength of 375 nm and the decay time for the excited photons emitted at a wavelength of 530 nm was measured in a time-scan manner. The results of such measurement are shown in FIG. 4.

Figure 4:
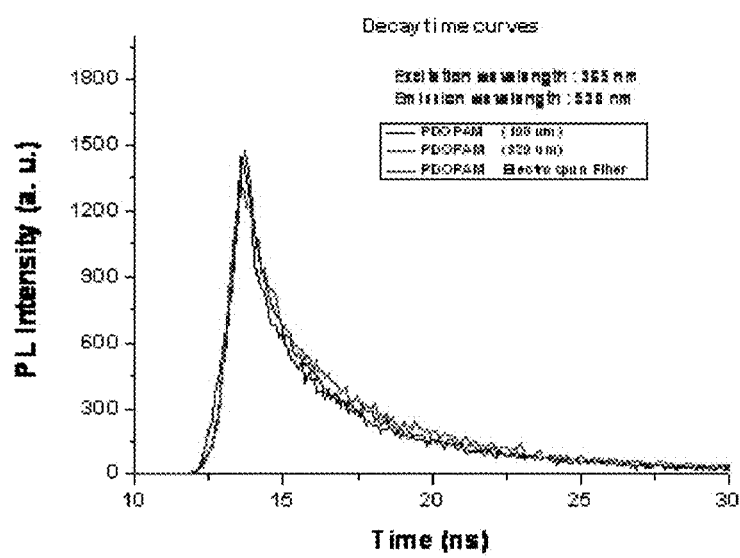
FIG. 4 illustrates results of measuring the decay time of fluorescence for the fluorescent film of Example 6 and the electrospun fiber of Example 8.

With reference to FIG. 4, the fluorescent films and the electrospun fibers of the examples absorb light of a wavelength of 365 nm to be excited, showing a higher intensity of fluorescence and emitting fluorescent light in a comparatively stable and uniform manner with a decay time ($\tau_2$) between 4.0 ns and 6.5 ns (nanosecond). Such results confirm that the fluorescent films and the electrospun fibers can emit excellent fluorescence.

3. Fluorescence Microscopic Image

The fluorescence images were taken for the fluorescent film being obtained in Example 6 (the thickness: 50 μm, 270 μm, and 600 μm) and the electrospun fibers obtained in Example 7 by using a fluorescence microscope, BX51, manufactured by OLYMPUS Co. Ltd. In the darkroom, the fluorescent films and the electrospun fibers were placed onto a slide glass and irradiated with three types of light having a wavelength of 330 to 385 nm, 460 to 490 nm, and 510 to 550 nm, respectively. The fluorescence images emitted from the samples were captured with a CCD camera (DP 70) with the exposure time being ⅓ seconds on a software.

Figure 5:
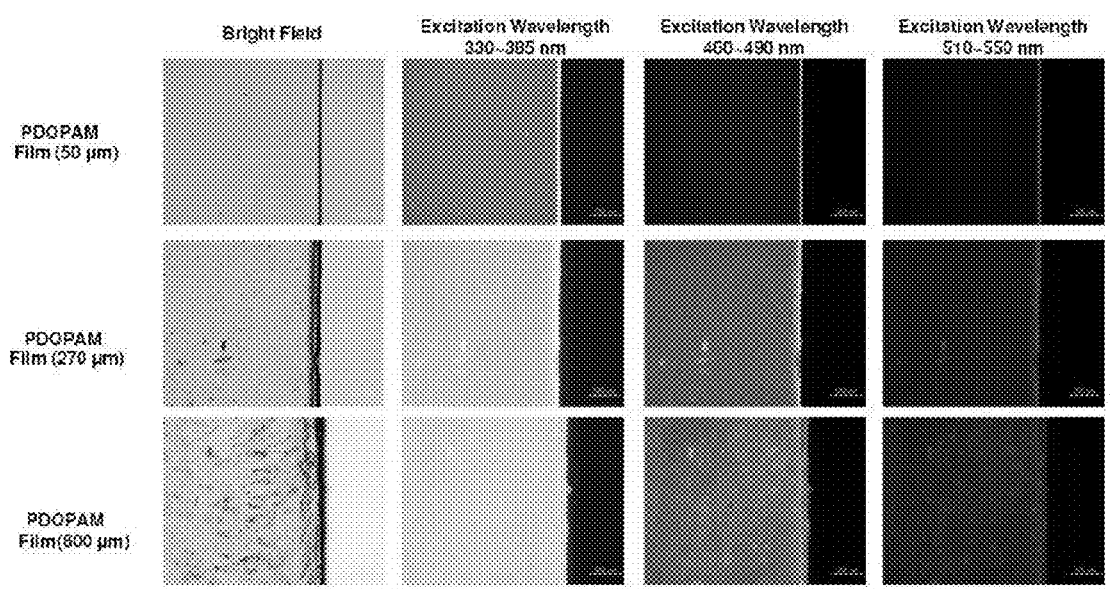
FIG. 5 and FIG. 6 show fluorescent microscopic images for the fluorescent film of Example 6 and the electrospun fibers of Example 8, respectively.
Figure 6:
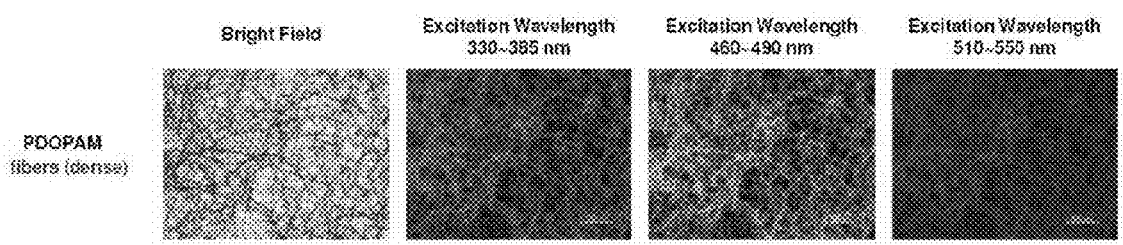

The fluorescent microscopic images obtained for the fluorescent films are shown in FIG. 5, and the fluorescence microscopic images obtained for the electrospun fibers are shown in FIG. 6. Referring to FIG. 5 and FIG. 6, light of a wavelength corresponding to blue, red, or green may be selectively emitted from the fluorescent film and electrospun fiber by controlling the wavelength of light irradiated thereon, and in all cases, an excellent level of fluorescence was confirmed.

What is claimed is:

1. A polymeric fluorescent material comprising a mesoporous acrylamide polymer including at least one repeating unit of Chemical Formula 1, wherein it is used for a fluorescence- or light-emitting substance in white illumination, an organic light emitting diode, an organic solar cell, a color filter for a display device, a backlight, a chemosensor, or fluorescence imaging for detection:

[Chemical Formula 1]

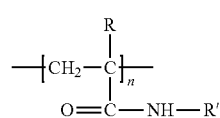

in Chemical Formula 1,
n is an integer of 15 to 1800,
R is hydrogen or methyl,
R' is X,

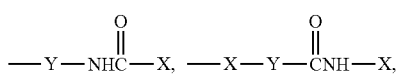

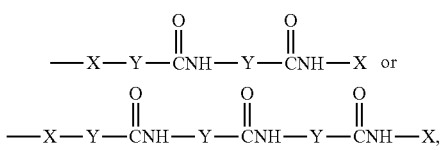

X is —Z—R″,
Y is an alkylene of $C_1$ to $C_{10}$,
Z is an arylene of $C_6$ to $C_{20}$, and
R″ is a linear or branched hydrocarbon of $C_{10}$ to $C_{20}$, or a linear or branched perfluorohydrocarbon of $C_{10}$ to $C_{20}$.

2. The polymeric fluorescent material in accordance with claim 1, wherein Z comprises

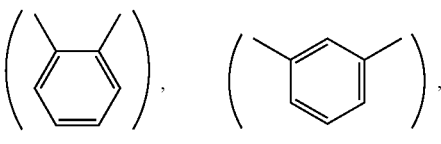

o-phenylene, m-phenylene

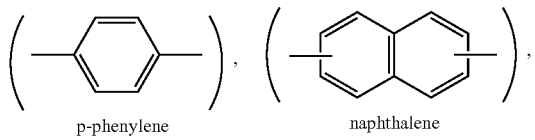

p-phenylene, naphthalene

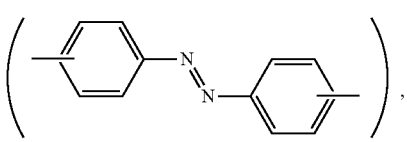

azobenzene

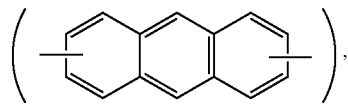

anthracene

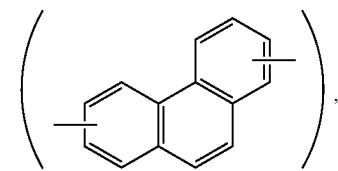

phenanthrene

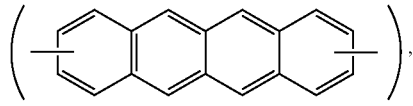

tetracene

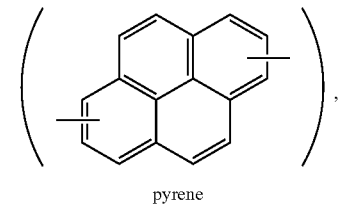

pyrene

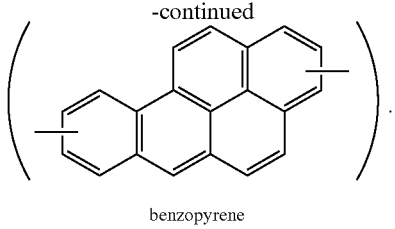

benzopyrene

3. The polymeric fluorescent material in accordance with claim 1, wherein the acrylamide polymer has a number average molecular weight of 5,000 to 500,000.

4. The polymeric fluorescent material in accordance with claim 1, wherein the acrylamide polymer has a plurality of pores having a diameter of 3.0 to 10.0 nm.

5. The polymeric fluorescent material in accordance with claim 1, wherein it comprises a film including the acrylamide polymer.

6. The polymeric fluorescent material in accordance with claim 5, wherein the film has a thickness of 20 nm to 1000 μm.

7. The polymeric fluorescent material in accordance with claim 1, wherein it comprises an electrospun fiber comprising the acrylamide polymer.

8. The polymeric fluorescent material in accordance with claim 7, wherein the electrospun fiber has a fiber diameter of 200 nm to 20 μm.

9. The polymeric fluorescent material in accordance with claim 1, wherein it absorbs light of a wavelength between 300 and 700 nm to fluoresce.

10. The polymeric fluorescent material in accordance with claim 9, wherein it emits light of a wavelength between (an absorbed wavelength+10) nm and (2×an absorbed wavelength−10) nm.

11. A polymeric fluorescent material comprising a mesoporous acrylamide polymer including at least one repeating unit of Chemical Formula 1:

[Chemical Formula 1]

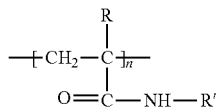

in Chemical Formula 1,
n is an integer of 15 to 1800,
R is hydrogen or methyl,
R' is X,

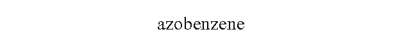
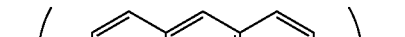
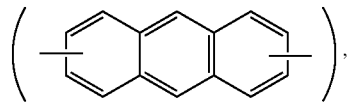

X is —Z—R",
Y is an alkylene of $C_1$ to $C_{10}$,
Z is an arylene of $C_6$ to $C_{20}$, and
R" is a linear or branched hydrocarbon of $C_{10}$ to $C_{20}$, or a linear or branched perfluorohydrocarbon of $C_{10}$ to $C_{20}$.

12. The polymeric fluorescent material in accordance with claim 11, wherein Z comprises

o-phenylene    m-phenylene

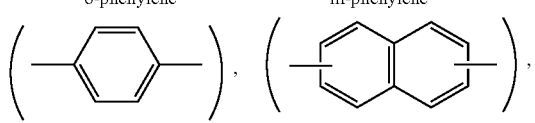

p-phenylene    naphthalene

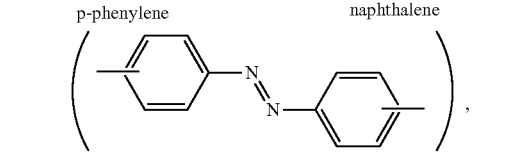

azobenzene

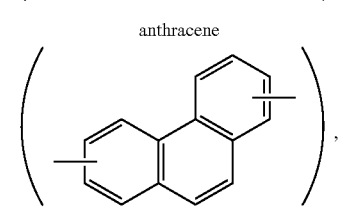

anthracene

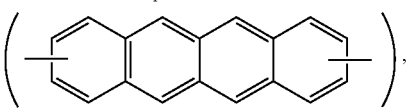

phenanthrene

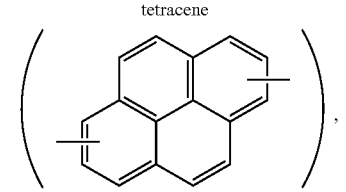

tetracene

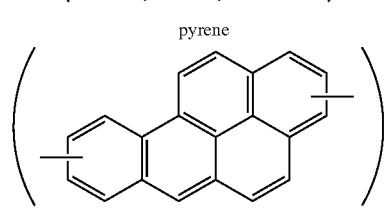

pyrene

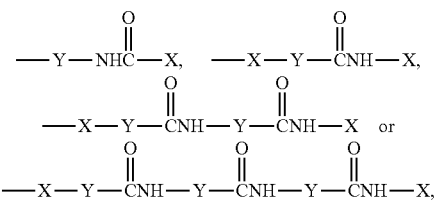

benzopyrene

13. The polymeric fluorescent material in accordance with claim 11, wherein the acrylamide polymer has a number average molecular weight of 5,000 to 500,000.

14. The polymeric fluorescent material in accordance with claim 11, wherein the acrylamide polymer has a plurality of pores having a diameter of 3.0 to 10.0 nm.

15. The polymeric fluorescent material in accordance with claim 11, wherein it comprises a film including the acrylamide polymer.

16. The polymeric fluorescent material in accordance with claim 15, wherein the film has a thickness of 20 nm to 1000 μm.

17. The polymeric fluorescent material in accordance with claim 11, wherein it comprises an electrospun fiber comprising the acrylamide polymer.

18. The polymeric fluorescent material in accordance with claim 17, wherein the electrospun fiber has a fiber diameter of 200 nm to 20 μm.

19. The polymeric fluorescent material in accordance with claim 11, wherein it absorbs light of a wavelength between 300 and 700 nm to fluoresce.

20. The polymeric fluorescent material in accordance with claim 19, wherein it emits light of a wavelength between (an absorbed wavelength+10) nm and (2×an absorbed wavelength−10) nm.

* * * * *